United States Patent
Saito et al.

(10) Patent No.: US 6,617,521 B1
(45) Date of Patent: Sep. 9, 2003

(54) CIRCUIT BOARD AND DISPLAY DEVICE USING THE SAME AND ELECTRONIC EQUIPMENT

(75) Inventors: Hideya Saito, Matsumoto (JP); Kogo Endo, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/467,805

(22) Filed: Dec. 20, 1999

(30) Foreign Application Priority Data

Dec. 21, 1998 (JP) ............................... 10-362586
Feb. 2, 1999 (JP) ............................... 11-025012
Nov. 26, 1999 (JP) ............................... 11-335854

(51) Int. Cl.[7] .................................... H05K 1/16
(52) U.S. Cl. .......................... 174/260; 439/55
(58) Field of Search .................. 174/260, 263; 439/55

(56) References Cited

U.S. PATENT DOCUMENTS 4,010,488 A * 3/1977 Gruszka et al.
4,972,580 A * 11/1990 Nakamura
5,945,984 A * 8/1999 Kuwashiro ................. 345/206

FOREIGN PATENT DOCUMENTS

| JP | 61-156239 | | 9/1986 |
| JP | 63-157430 | | 6/1988 |
| JP | 1-153640 | | 10/1989 |
| JP | 03-048436 | | 3/1991 |
| JP | 03-244140 | | 10/1991 |
| JP | 04-171951 | | 6/1992 |
| JP | 06-097208 | | 4/1994 |
| JP | 07161771 A | * | 6/1995 |
| JP | 08-335593 | | 12/1996 |

* cited by examiner

Primary Examiner—Khiem Nguyen
(74) Attorney, Agent, or Firm—Harness, Dickey & Pierce, P.L.C.

(57) ABSTRACT

A circuit board is manufactured by forming an input wiring 420a, an output wiring 420b, and dummy wiring layer 422 in an IC chip mounting area on a base film 410 having insulation and flexibility without using an adhesive layer, and mounting an IC chip 450 on an intervening anisotropic conductive film of an adhesive resin 19 into which electrically conductive particles 21 are dispersed. The dummy wiring layer 422 is electrically isolated from the input wiring 420a, the output wiring 420b, and IC chip electrodes 450a and 450b, and has a plurality of openings 422a.

37 Claims, 13 Drawing Sheets

DIRECTION OF COLUMNS

DIRECTION OF ROWS

CIRCUIT BOARD AND DISPLAY DEVICE USING THE SAME AND ELECTRONIC EQUIPMENT

BACKGROUND OF THE INVENTION

1. Technical Field of the Invention

The present invention relates to a circuit board which is produced by flipchip-mounting a semiconductor chip on a base board, and a display device and electronic equipment, employing the circuit board.

2. Description of the Related Art and Problems to be Solved by the Invention A technology for directly mounting electronic components, such as IC chips, on a FPC (Flexible Printed Circuit) board is currently in increasing use to keep pace with a current trend toward to a smaller, thinner, and lighter board, to meet a bendable design requirement, and to accomplish high yield using a roll-to-roll process. Since such a technology does not need inner leads, like the TAB (Tape Automated Bonding) technology, thin copper foils work, and the promotion of fine pitch design in wiring is easy.

FIG. 16 is a cross-sectional view showing a conventional structure in which an electronic component is mounted on an FPC board. As shown, an input electrode 450a of an IC chip 450 and an input wiring 420a beforehand formed on the base film 410 are electrically connected to each other through electrically conductive particles 21 dispersed within an adhesive resin 19. Similarly, an output electrode 450b of the IC chip 450 and an output wiring 420b beforehand formed on the base film 410 are electrically connected to each other through electrically conductive particles 21 dispersed within an adhesive resin 19.

Since the base film 410, as a base material for the FPC board, typically contains organic film, such as PI (polyimide), which is pervious to water, moisture penetrates from the back side (the underside in FIG. 16) opposite the mounting side into the base film 410 and reaches the wiring formation plane of the IC chip 450. For this reason, the reliability of the IC chip is compromised, or light leakage of light transmitted through the base film 410 degrades the reliability of the IC chip. This disadvantage becomes more pronounced if the base film 410 is made thinner.

Since the polyimide having a low surface wettability is typically used for the base film 410 as the base material of the FPC board, a bonding strength of an adhesive resin is extremely weak.

The effect of thermal coefficients of expansion, different from the base film 410, to the IC chip 450, and to the adhesive resin 19, allows stress to concentrate in a bonding interface with time, and lowers the bonding strength, thereby leading to a poor contact between the electrodes of the IC chip 450 and the wiring of the FPC board. Particularly when the base film is a thin material having flexibility, moisture penetrates from the base film, and the bonding strength drops, thereby leading to a poor contact between the electrodes of the IC chip 450 and the wiring of the FPC board in a more pronounced fashion.

In view of the above problem, the present invention has been developed. The object of the present invention is to provide a circuit board, of a type that has an IC chip, such as a semiconductor chip, mounted on a base board using an adhesive resin, and capable of at least one of the following goals, and a display device and electronic equipment, both employing the circuit board.

1) Improving the bonding strength of the adhesive resin to the base board;
2) Improving electrical connection reliability between the semiconductor chip and a wiring board having the base board and the wiring;
3) Preventing drops in the performance and reliability of the semiconductor chip; and
4) Reducing the penetration of moisture from the back side opposite the mounting side to the bonding area of the base board.

SUMMARY OF THE INVENTION (1) A circuit board of the present invention includes a wiring board including a base material having insulation, and a plurality of board-side terminals arranged on the base material, and a semiconductor chip, mounted on the wiring board, having a plurality of semiconductor-side terminals, with the semiconductor-side terminals electrically connected to the board-side terminals, wherein the wiring board includes a dummy wiring layer, which is isolated from the board-side terminals and the semiconductor-side terminals, and which is inside the board-side terminals, and within an area where the semiconductor chip is mounted.

In accordance with the present invention, at least part of moisture penetrating through the base material from the side opposite the mounting side of the semiconductor chip is blocked by the dummy wiring layer. This arrangement reduces the possibility that a moisture penetration degrades the reliability of the board-side terminals and the semiconductor-side terminals in the area of the wiring board where the semiconductor chip is mounted. When the semiconductor chip is mounted on the wiring board, the circuit board is subject to short circuits and half-short/half-open circuits under the effect of moisture, because the pitches of the board-side terminals, the semiconductor terminals, and a wiring pattern are typically fine. The circuit board of the present invention reduces the creation of such a problem.

A current leakage can take place in the semiconductor chip due to the penetration of light. Since the dummy wiring layer reduces the quantity of light admitted through the base material, a drop in the performance of the semiconductor chip associated with the current leakage is controlled.

(2) A circuit board of the present invention further includes a resin encapsulation section, which encapsulates an area where the semiconductor-side terminals are electrically connected to the board-side terminals, and bonds the semiconductor chip to the wiring board.

In accordance with the present invention, a bonding area of the resin encapsulation section to the wiring board is increased by arranging the dummy wiring area inside the board-side terminals, and within an area of the surface of the base material where the semiconductor chip is mounted. The bonding strength is thus enhanced. As a result, the bonding strength of the resin encapsulation section to the wiring board is increased, and the connection reliability between the semiconductor-side terminals and the board-side terminals is enhanced. Further with this arrangement, the dummy wiring layer prevents the penetration of moisture from the base board, and a drop in the bonding strength of the resin encapsulation section with time is thus controlled. Since the dummy wiring layer is constructed of a material having a higher bond to the resin encapsulation section than to the base material, the bonding strength of the resin encapsulation section to the wiring board is increased.

(3) In a circuit board of the present invention, the resin encapsulation section is manufactured of an anisotropic conductive film which is formed by dispersing electrically conductive particles into a resin, and the semiconductor-side terminals are electrically connected to the board-side terminals by the electrically conductive particles.

If the semiconductor chip is bonded to the wiring board using the anisotropic conductive film in this way, a bonding step and a mold step, corresponding to two steps in the TAB (Tape Automated Bonding) mounting, are carried out in a single step, and the manufacturing process is thus shortened.

(4) In a circuit board of the present invention, the dummy wiring layer is constructed of the same material as the material of the board-side terminal.

When the board-side terminal is manufactured of Cu (copper), for example, the dummy wiring layer is also manufactured of Cu along with the board-side terminal. When the board-side terminal of Cu is plated with Ni or Au, the dummy wiring layer of Cu is also plated with the same material.

The dummy wiring layer and the board-side terminal are thus produced at the same time, thereby simplifying the manufacturing process of the circuit board.

(5) In a circuit board of the present invention, the base material is constructed of a material having flexibility.

For example, the base material is constructed of a material, such as polyimide, having flexibility. When the base material is formed of a thin material having flexibility, the base material is deformable under the application of an external force. For this reason, when the resin encapsulation section bonds the semiconductor chip to the wiring board, stress concentrates in a bonding interface in a localized fashion between the base material and the resin encapsulation section, reducing the bonding strength and thereby leading to a poor contact between the semiconductor-side terminal and the board-side terminal with time. When the base material is a thin material of polyimide, for example, the penetration of moisture from the base material reduces the bonding strength, and thereby easily leads to a poor contact between electrode terminals with time. In a circuit board in which a semiconductor chip is mounted on a wiring board constructed of a base material having flexibility using an adhesive agent, if the dummy wiring layer is arranged inside the board-side terminals and within the area of the surface of the base material where the semiconductor chip is mounted in accordance with the present invention, the bonding strength of the resin encapsulation section to the base material improves, and the connection reliability between the semiconductor-side terminal and the board-side terminal is enhanced.

(6) In a circuit board of the present invention, the base material is directly connected to each of the dummy wiring layer and the board-side terminals without any intervening adhesive layer.

When each of the dummy wiring layer and the board-side terminals is directly connected to the base material without any intervening adhesive layer, the circuit board is free from a current leakage due to the adhesive layer and a swell of the adhesive agent, and the flexibility of the wiring board is increased.

(7) A circuit board of the present invention further includes an opening, which is in contact with the dummy wiring layer in a plan view, and through which the base material is exposed, and which is continuous with the peripheral exposed area of the base material, and the dummy wiring layer is in contact with the opening only, in a plan view.

In accordance with the present invention, when the semiconductor chip is pressed onto the adhesive resin, to become the resin encapsulation section, against the wiring board, the adhesive resin is pushed outwardly to an external area through the opening, residual stress in the resin encapsulation section is reduced. The thickness of the resin encapsulation section is thus made uniform. With this arrangement, the base material is free from distortion and has a reduced residual stress, and the connection reliability is increased.

(8) In a circuit board of the present invention, the dummy wiring layer is a single continuously connected region.

(9) In a circuit board of the present invention, according to (8), the dummy wiring layer is a region curved in a serpentine fashion.

(10) In a circuit board of the present invention, according to (8), the dummy wiring layer is a region that is a combination of a plurality of first line segments mutually running in parallel and a second line segment which extends across the first line segments.

(11) In a circuit board of the present invention, according (1) through (6), the dummy wiring layer includes at least one aperture.

In accordance with the present invention, the dummy wiring layer having the aperture is formed on the base material in the area where the semiconductor chip is to be mounted. When the resin encapsulation section bonds the semiconductor chip to the wiring layer, the bonding interface between the wiring layer and the resin encapsulation section becomes textured. The mechanical engagement between the wiring board and the resin encapsulation section adds to the bonding strength. The reliability of the bond is thus substantially improved.

(12) In a circuit board of the present invention, according to one of (1) through (6), the dummy wiring layer is formed of a plurality of dummy wiring regions which are spaced by exposed areas of the base material.

In accordance with the present invention, when the resin encapsulation section bonds the semiconductor chip to the wiring layer, the bonding interface between the wiring layer and the resin encapsulation section becomes textured. The mechanical engagement between the wiring board and the resin encapsulation section adds to the bonding strength. The reliability of the bond is thus substantially improved.

(13) In a circuit board of the present invention, according to (12), the plurality of the dummy wiring regions are partially connected to each other. With this arrangement, the bond between the resin encapsulation section and the wiring board is enhanced when the resin encapsulation section bonds the semiconductor chip to the wiring board.

(14) In a circuit board of the present invention, according to one of (1) through (6), the dummy wiring layer includes at least one recessed area where the thickness of the dummy wiring layer is thinner than the thickness of the dummy wiring layer on the remaining area.

In accordance with the present invention, when the resin encapsulation section bonds the semiconductor chip to the wiring board, the bonding interface between the wiring layer and the resin encapsulation section becomes textured. The mechanical engagement between the resin encapsulation and the wiring board adds to the bonding strength. The reliability of the bond is thus substantially improved.

(15) A display device of the present invention includes a circuit board according to one of (1) through (14), and a flat panel having connection terminals electrically connected to the circuit board.

(16) In a display device of the present invention, according to (15), the flat panel is a liquid-crystal panel including a pair of opposing substrates, and a liquid crystal interposed between the pair of the substrates, and the connection terminals are formed on at least one of the pair of the substrates.

(17) Electronic equipment of the present invention includes, as display means, a display device according to one of (15) and (16).

DETAILED DESCRIPTION OF THE PREFERRED EMBODIMENTS

Figure 1:
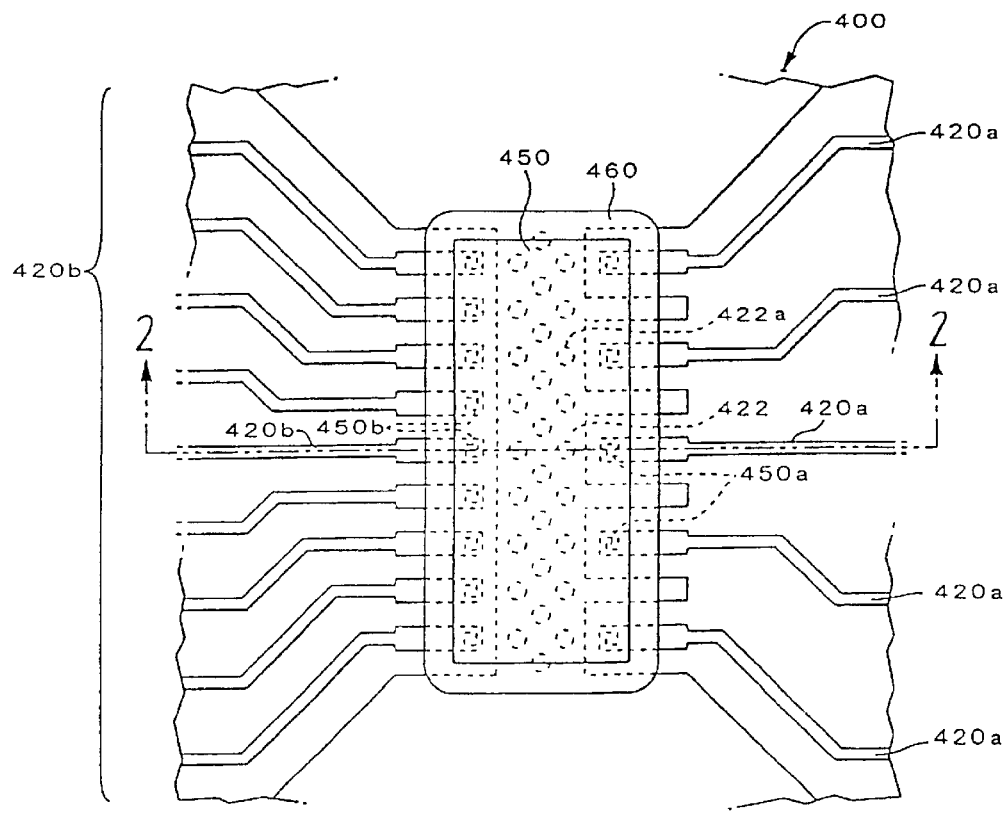
FIG. 1 is a plan view showing a circuit board of a first embodiment of the present invention.
Figure 2:
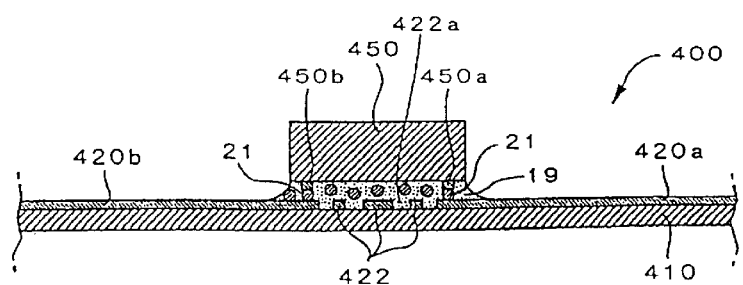
FIG. 2 is a cross-sectional view of the circuit board in FIG. 1, taken along line A—A.

The preferred embodiments of the present invention are more specifically discussed, referring to the drawings.
1. First Embodiment
1.1 Circuit Board Discussed now is a mounting structure in a circuit board (wiring board) in accordance with a first embodiment of the present invention. FIG. 1 is a plan view showing part of the circuit board, and FIG. 2 is a cross-sectional view of the circuit board taken along line A—A in FIG. 1. As shown in these figures, a FPC (Flexible Printed Circuit) board 400, as the wiring board, having wiring pattern 420, is manufactured, first by forming copper films on both sides of a base film 410, as a base material, having insulation and flexibility, through sputtering or deposition process, second by patterning the copper film to a predetermined shape through known photolithographic process or etching process, and third by plating the patterned copper film with copper. The FPC board 400 may be a wiring board which is manufactured by applying polyamic acid, which is a precursor of polyimide, on a copper foil, and by thermally polymerizing the polyamic acid coated copper foil for polyimidization. The wiring board is produced with the resulting polyimide working as the base film 410.

The wiring board, as the FPC board 400, may be produced by laminating copper foils on both sides of a base film 410 using an adhesive agent, and then by patterning the copper foils to a predetermined shape. As already discussed, however, the wiring board on which the wiring pattern is directly formed on the base film 410 is advantageous in that the wiring board is free from a current leakage between adjacent wiring patterns through the adhesive agent and free from a swell of the adhesive agent, and that the flexibility of the FPC board 400 is increased.

Besides the polyimide, other organic film such as polyethylene terephtalate or polyester may be used for the base film 410 as the base material. The wiring pattern formed on the FPC board 400 includes an input wiring 420a, an output wiring 420b and a dummy wiring layer 422.

A rectangular parallelopiped IC chip 450 (semiconductor chip) has a plurality of input electrodes 450a and a plurality of output electrodes 450b on one surface along its sides, as semiconductor-side terminals. With its surface bearing the input electrodes 450a and the output electrodes 450b facing downward, the IC chip 450 is mounted onto the FPC board 400. Each of the input electrodes 450a and the output electrodes 450b is beforehand formed of a bump (a projected electrode) of Au, for example. When the IC chip 450 is bonded onto the FPC board 400, the IC chip 450 is placed onto the FPC board 400 at a predetermined location with an anisotropic conductive film (ACF) interposed therebetween. The ACF is produced by uniformly dispersing electrically conductive particles in an adhesive resin 19 of epoxy or the like. The IC chip 450, in its heated state, is pressed onto the heated and pressurized anisotropic conductive film against the FPC board 400 for bonding. A circuit board is thus produced by mounting the IC chip 450 as a semiconductor chip onto the FPC board 400 as a wiring board.

Referring to FIG. 2, in the mounting operation, the input electrodes 450a are respectively electrically connected to input wirings 420a (board-side terminals) and the output electrodes 450b are respectively electrically connected to output wirings 420b (board-side terminals), using electrically conductive particles 21 which are dispersed at a proper ratio into the adhesive resin 19, such as an epoxy resin or a photo-curing resin. The adhesive resin 19 also works as a resin encapsulation section which protects the surface of the IC chip 450 bearing the input electrodes 450a and the output electrodes 450b from moisture, contamination, and stress, while bonding the IC chip 450 to the FPC board 400.

When the IC chip 450 and the FPC board 400 are bonded to each other using the anisotropic conductive film, the bonding step and the mold step in the conventional TAB mounting are carried out in a single step, thereby advantageously shortening the manufacturing process.

The dummy wiring layer 422 in this embodiment is formed in the area where the IC chip 450 is mounted in a manner such that the dummy wiring layer 422 remains out of contact with the input wirings 420*a* and the output wirings 420*b*, as the board-side terminals. The dummy wiring layer 422 has a plurality of apertures 422*a* as shown in FIG. 1 and FIG. 2. In the area where the IC chip 450 is mounted, the exposed area of the base film 410 having a flat surface is reduced and the dummy wiring layer 422 having a plurality of the apertures 422*a* is present on top of the base film 410. In addition to the bonding strength between the base film 410 and the adhesive resin 19, a mechanical engagement structure presented by the dummy wiring layer 422 improves mechanical strength, thereby substantially improving the bonding strength between the adhesive resin 19 and the wiring board 400.

The presence of the dummy wiring layer 422 minimizes, in the mounting area of the IC chip 450, the area of the base film 410 which is exposed because no copper foil is present. Referring to FIG. 2, moisture penetrating from the back side of the base film 410 is blocked by the dummy wiring layer 422, and most of the moisture cannot reach the adhesive resin 19 as the resin encapsulation section. With this arrangement, the reliability degradation of the IC chip 450 is prevented. Like moisture, most of light penetrating from the back side of the base film 410 is also blocked by the dummy wiring layer 422, unable to enter an electrode formation surface (wiring formation surface) of the IC chip 450, and the reliability degradation of the IC chip 450 due to a light current leakage is prevented.

In the above embodiment, the connection between the input electrode 450*a* and the input wiring 420*a*, and the connection between the output electrode 450*b* and the output wiring 420*b* are performed by the electrically conductive particles 21 dispersed into the adhesive resin 19, namely, by the anisotropic conductive film, but other connection methods are also acceptable. For example, the copper foil, forming the input wiring 420*a* and the output wiring 420*b*, may be plated with Au, and Au-plated wirings may be connected to Au bumps of the input electrode 450*a* and the output electrode 450*b* of the IC chip 450 to form Au—Au connections. Alternatively, the foil, forming the input wiring 420*a* and the output wiring 420*b*, is plated with tin, and the tin-plated wirings are then connected to the Au bumps of the input electrode 450*a* and the output electrode 450*b* of the IC chip 450 through contact heating to form Au—Sn eutectic bonding. Alternatively, the copper foil, forming the input wiring 420*a* and the output wiring 420*b*, is patterned to be ready for soldering, and the bumps of the input electrode 450*a* and the output electrode 450*b* of the IC chip 450 are formed of solder to form solder—solder connections. In this case, an encapsulation material for the resin encapsulation section is used to mold around the IC chip 450.

The component mounted onto the FPC board 400 is not limited to the IC chip 450. For example, the component mounted onto the FPC board 400 may be other active or passive element, as long as there is a possibility that the element is subject to moisture and light penetrating through the base film 410, when mounted on the FPC board 400.

The adhesive resin 19, containing the electrically conductive particles 21 dispersed therewithin, may be clumped to the input electrode 450*a* and the output electrode 450*b* of the IC chip 450. After the input electrode 450*a* is connected to the input wiring 420*a*, and the output electrode 450*b* is connected to the output wiring 420*b*, the encapsulation material for the resin encapsulation section is molded around these connections.

Since the dummy wiring layer 422 serves no wiring purposes, a capacitor is inconveniently created there if no potential is set to it. For this reason, the dummy wiring layer 422 is preferably connected to a wiring at the ground potential.

1.2 Display Device

As described above, when the IC chip 450 is mounted on the FPC board 400, the time required for the mounting process is constant regardless of the number of connection electrodes of the IC chip 450, in contrast to the wire bonding method. For this reason, manufacturing yield is substantially increased when the number of electrodes of the IC chip 450 is high. An example of an IC chip having a large number of electrodes is a drive circuit (driver) for driving data lines and scanning lines in a display device. Discussed as an application of the mounting structure is a liquid-crystal apparatus having an FPC board with a driver IC mounted thereon.

Figure 3:
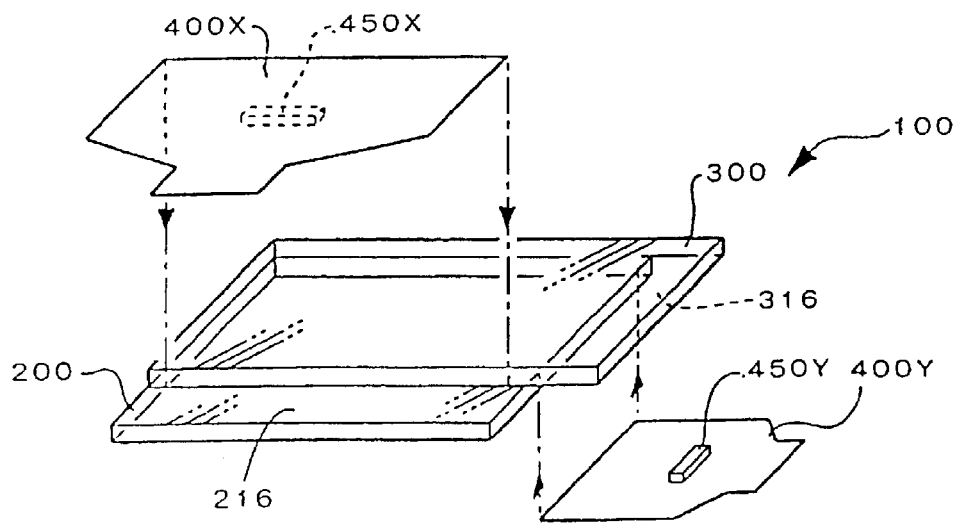
FIG. 3 is an exploded perspective view showing two FPC boards having the structure shown in FIG. 1 and FIG. 2 and a liquid-crystal display panel.

Referring to FIG. 3, a liquid-crystal display device includes a liquid-crystal display panel 100, two FPC boards 400X and 400Y connected to the liquid-crystal display panel 100, and a control circuit board (not shown) connected to the FPC boards 400X and 400Y. The liquid-crystal display panel 100 has a structure in which a device substrate 200 having a plurality of data lines formed thereon is bonded to an opposing substrate 300 having a plurality of scanning lines formed thereon, with the electrode formation surfaces of the two substrates facing each other and with their terminal areas 216 and 316 projected.

Figure 4:
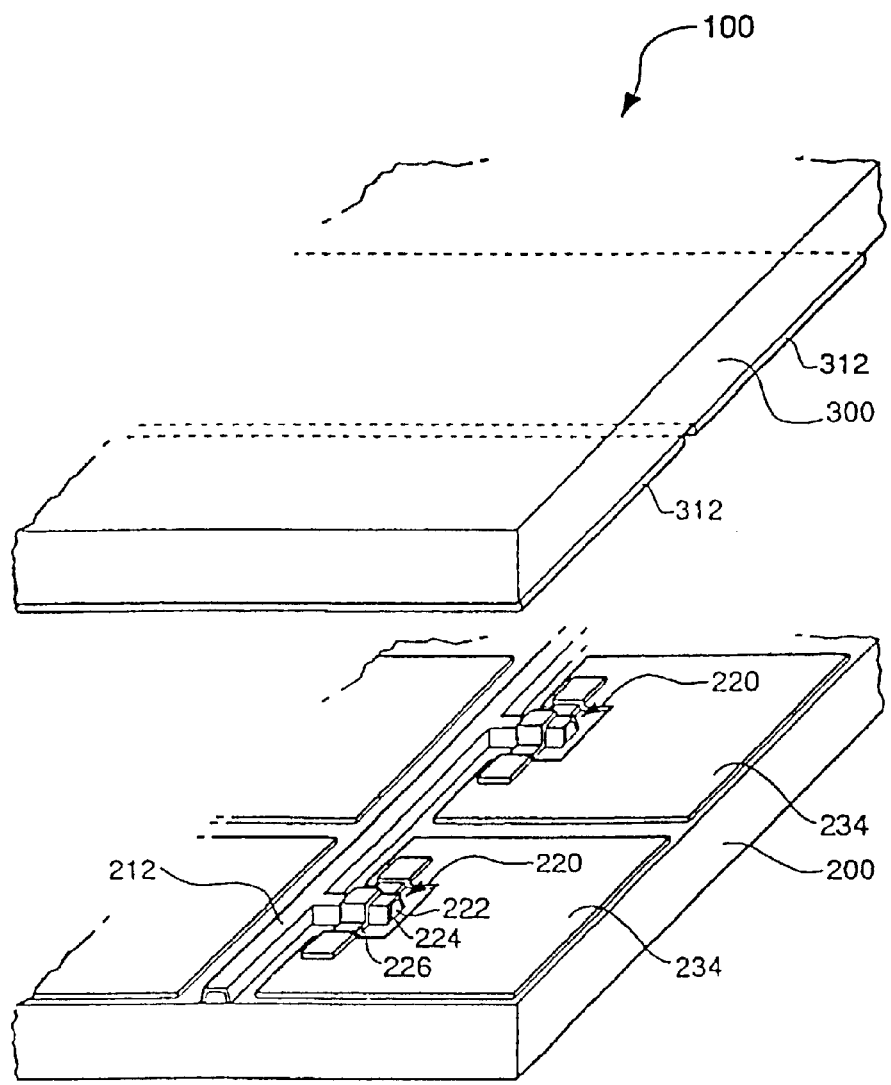
FIG. 4 is a perspective view of the liquid-crystal display panel of the first embodiment, with its panels partially broken away.
Figure 4:

As shown more in detail in FIG. 4, the device substrate 200, on its surface facing the opposing substrate 300, includes a plurality of pixel electrodes 234 arranged in a matrix, and data lines (signal lines) 212, each extending in the direction of columns. Pixel electrodes 234 on each column are connected to a single data line 212 via TFD (Thin Film Diode) devices 220. The TFD device 220, if viewed from the substrate, includes a first metal film 222, an oxide film 224, which is produced by anodizing the first metal layer 222, and a second metal film 226, and has thus a sandwich structure of a metal/insulator/metal. For this reason, the TFD device 220 has a switching characteristic as a positive-negative two-way diode.

The opposing substrate 300, on its surface facing the device substrate 200, includes scanning lines 312 which are arranged, in the direction of rows perpendicular to the data lines 212, as electrodes opposing pixel electrodes 234, and color filters, although not shown, respectively opposing the pixel electrodes 234. A single liquid-crystal cell, corresponding to one pixel, is thus constructed of a pixel electrode 234, a scanning line 312 as an opposing electrode, and a liquid crystal encapsulated in the gap between both substrates.

A constant gap (space) is maintained between the device substrate 200 and the opposing substrate 300 with a sealing material applied on the peripheries of the substrates and with spacers appropriately dispersed therebetween, and a liquid crystal of TN (Twisted Nematic) type, for example, is encapsulated in the enclosed space. A rubbing processed alignment layer is arranged on the facing surface of each of the device substrate 200 and the opposing substrate 300, and a polarizer is arranged on the opposite surface of each substrate (the alignment layers and the polarizers are not shown). However, if a polymer dispersed liquid crystal, in which a liquid crystal in the form of fine particles is dispersed in a polymer, is used, the alignment layers and the polarizers are dispensed with. The use of the polymer dispersed liquid crystal achieves a high utilization of light, advantageously helping promoting high luminance and low-power consumption design.

In the above construction, each of the data lines 212 and each of the scanning lines 312 are electrically connected at each intersection via a serial connection of a liquid crystal and a TFD element 220 therebetween. For this reason, when a voltage above a threshold is applied to the TFD element 220 in response to a scanning signal applied to the scanning line 312 and a data signal applied to the data line 212, the corresponding element is turned on, and the liquid crystal layer connected to the corresponding element stores a predetermined charge. When the element is turned off subsequent to the charge storage, the charge stored in the liquid crystal layer is maintained if a resistance of the liquid crystal layer is high enough. When the TFD element 220 is turned on or off to control the quantity of charge stored in this way, each pixel varies in its alignment state, presenting predetermined information. Since the duration during which the charge is stored in each pixel is permitted to be a fraction of one period, a time-division multiplex driving with each of the data line 212 and the scanning line 312 connected to a plurality of pixels is realized by selecting the scanning lines 312 in a time-division manner. The scanning lines and the data lines are reversed so that the scanning lines are formed on the device substrate 200 and the data lines are formed on the opposing substrate.

Although not shown in FIG. 3, the terminal area 216 of the device substrate 200 has data line terminals, from which extension lines from respective data lines run outwardly, while the terminal area 316 of the opposing substrate 300 has, on its underside, scanning line terminals, from which extension lines from respective scanning lines run outwardly.

The FPC boards 400X and 400Y have the construction of the above-referenced circuit board including the FPC board 400, the IC chip 450 and the dummy wiring layer 422. In the FPC board 400X, a driver 450X for driving the data lines is mounted as an IC chip in a direction upside down and inverted from that shown in FIG. 2. A dummy wiring layer 422X is arranged on the driver 450X mounting side as shown in FIG. 3. In the FPC board 400Y, a driver 450Y for driving the scanning lines is mounted as an IC chip in the same direction as that shown in FIG. 2. A dummy wiring layer 422Y is arranged on the driver 450Y mounting side of the FPC board 400Y as shown in FIG. 3.

In the FPC board 400X, on one side, terminals respectively extending from the input wirings are connected to the control circuit board, while on another side, terminals respectively extending from the output wirings, are connected to the data line terminals, as the connection terminals, formed on the terminal area 216 of the device substrate 200. Similarly, in the FPC board 400Y, on one side, terminals respectively extending from the input wirings are connected to the control circuit board, while on another side, terminals respectively extending from the output wirings are connected to the scanning line terminals, as the connection terminals, formed on the terminal area 316 of the opposing substrate 300.

With the above construction, the driver 450Y produces a scanning signal in response to a control signal supplied by the control circuit board, and feeds the scanning signal to each scanning line in the opposing substrate 300. On the other hand, the driver 450X feeds a data signal to each data line in the device substrate 200 in response to a control signal supplied by the control circuit board. The dummy wiring layers 422X and 422Y prevent the degradation in the reliability and performance of drivers 450X and 450Y respectively mounted on the FPC boards 400X and 400Y, as already discussed.

Besides this type of liquid crystal panel, the present invention is applied to a passive matrix liquid crystal display panel having no switching element, such as TFD element or a liquid crystal display panel in which scanning lines and data lines are arranged on a device substrate with a pixel electrode connected via a TFT (Thin Film Transistor) device at each intersection of the scanning lines and the data lines.

1.3 Electronic Equipment 1.3.1 Projector

Figure 5:
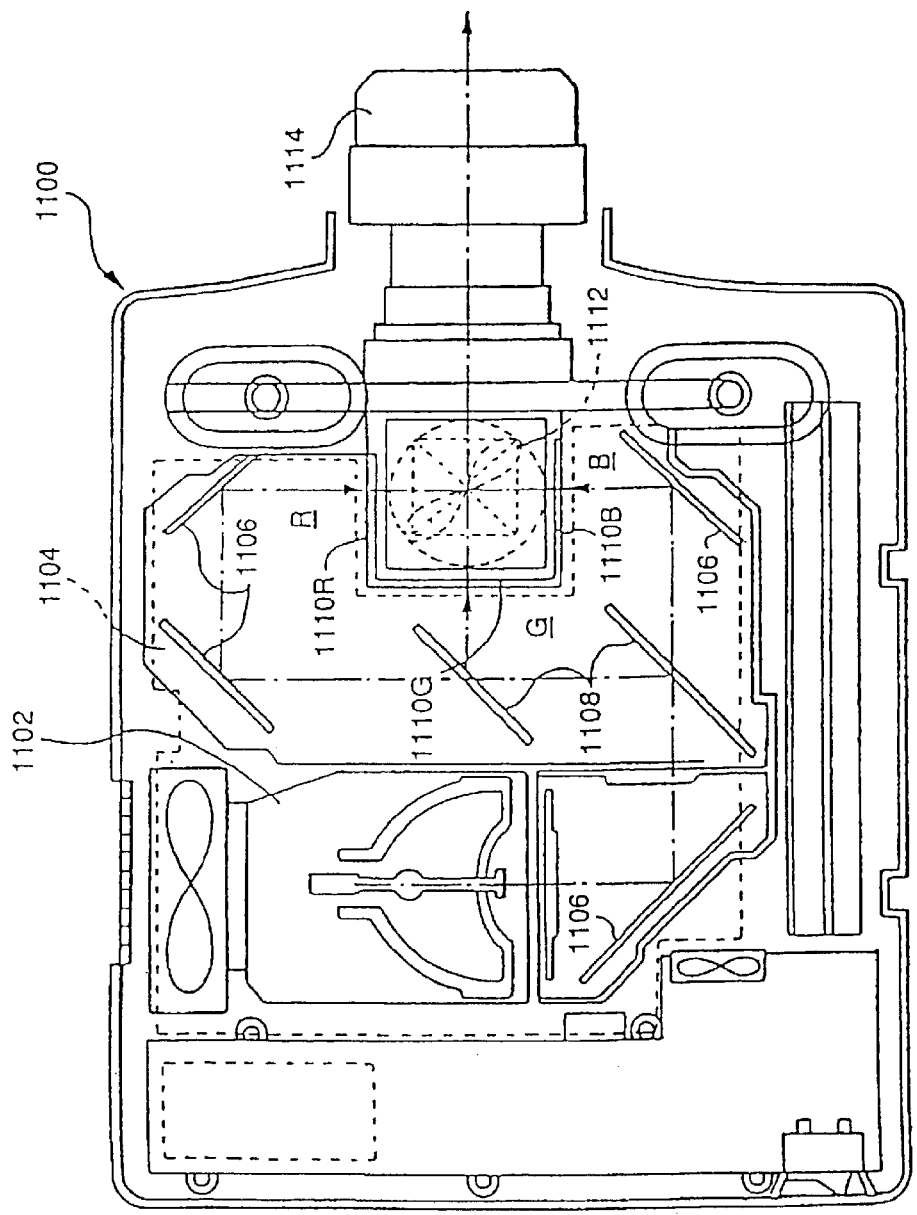
FIG. 5 is a sectional view showing the construction of a liquid-crystal projector as one example of electronic equipment that incorporates the liquid-crystal display device of the first embodiment.

Discussed next is an example of electronic equipment which employs the liquid-crystal device 1 as its display unit. FIG. 5 is a plan view showing an example of the projector that employs a liquid-crystal device as a light valve.

As shown, a projector 1100 includes a lamp unit 1102 composed of a white light source such as a halogen lamp. A light beam emitted from the lamp unit 1102 is separated through four mirrors 1106 and two dichroic mirrors 1108 in a light guide 1104 into the three primary colors RGB, which are respectively incident on liquid-crystal display panels 1110R, 1110G, and 1110B, as light valves corresponding to the three primary colors.

The liquid-crystal display panels 1110R, 1110G, and 1110B are the above-referenced liquid-crystal display panels, and are driven by R, G, and B primary color signals supplied by a video signal processing circuit (not shown) via the FPC board 400X and the FPC board 400Y. Light beams, modulated through these liquid-crystal display panels, are incident on a dichroic prism 1112 from three directions. In the dichroic prism 1112, the R and B light beams are refracted at a right angle, while the G light beam straightly travels. The images of the three colors are synthesized into a color image, and the synthesized image is projected through a projection lens 1114 onto a screen or the like.

Since through the dichroic mirrors 1108, the liquid-crystal display panels 1110R, 1110G, and 1110B receive light beams corresponding to the three primary colors R, G, and B, it is not necessary to arrange color filters on the opposing substrate 300.

1.3.2 Portable Telephone

Figure 6:
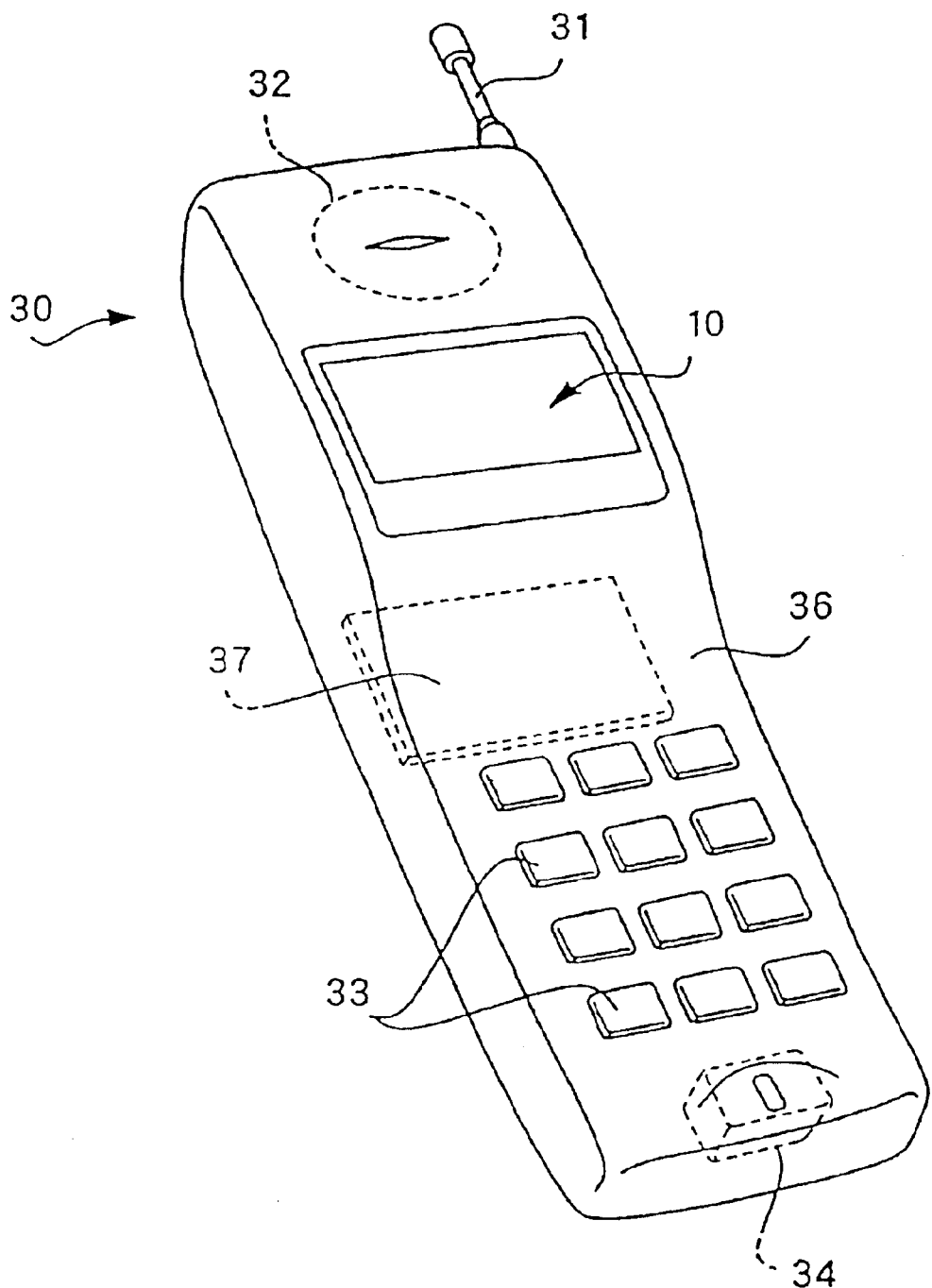
FIG. 6 is an external view of a portable telephone as one example of electronic equipment that incorporates the liquid-crystal device of the first embodiment.

FIG. 6 shows a portable telephone 30, as another example of electronic equipment which employs the above-referenced liquid-crystal display device 10 as its display unit. The portable telephone 30 houses, in an outer case 36 as an apparatus box, constituent parts, including an antenna 31, a loudspeaker 32, a liquid-crystal display device 1, key switches 33, a microphone 34, and so on. The outer case 36 houses a control circuit board 37 on which a control circuit for controlling the operation of each constituent part is mounted. The liquid-crystal display device 10 is the one shown in FIG. 3.

In the portable telephone 30, signals input through the key switches 33 and the microphone 34, and data received through the antenna 31 are input to the control circuit on the control circuit board 37. The control circuit presents an image, such as numerals, text, and figures, on a display screen of the liquid-crystal display device 10 in response to a diversity of input data, and transmits data through the antenna 31.

2. Second Embodiment

A second embodiment of the present invention is different from the first embodiment in the shape of the dummy wiring layer. The rest of the second embodiment remains unchanged from that of the first embodiment, and the discussion about it is omitted. In the figures, components identical to those described in conjunction with the first embodiment are designated with the same reference numerals.

Figure 7:
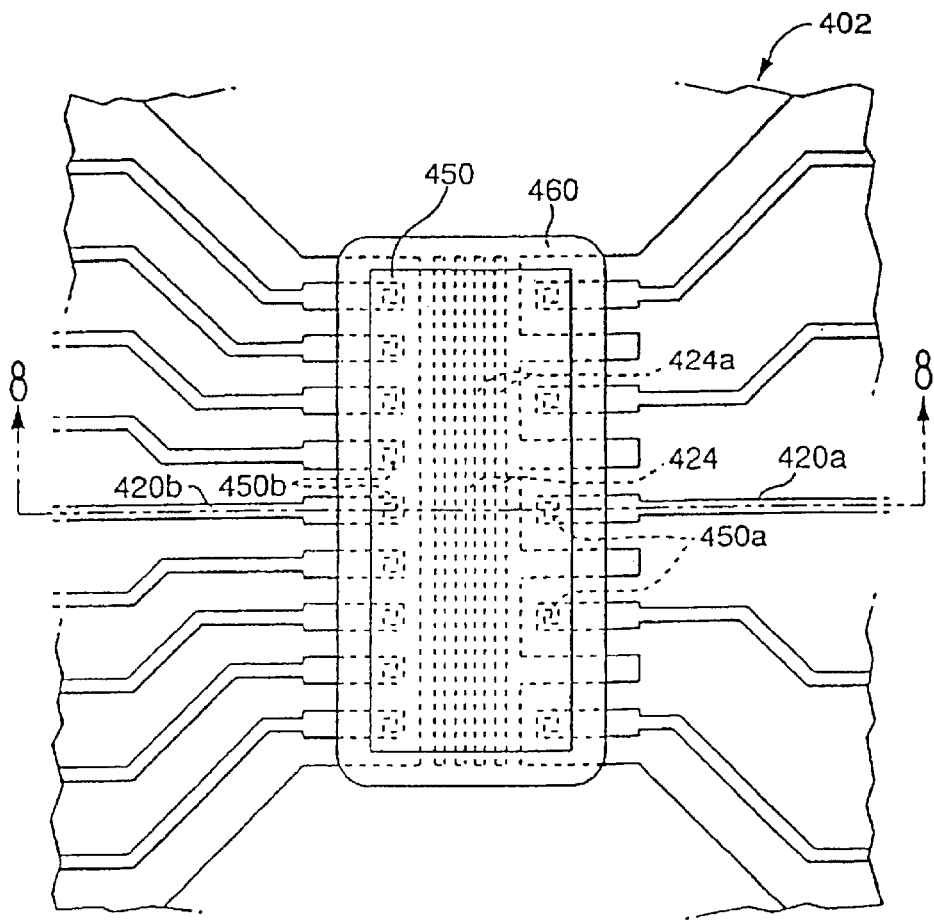
FIG. 7 is a plan view of a circuit board of a second embodiment of the present invention.
Figure 8:
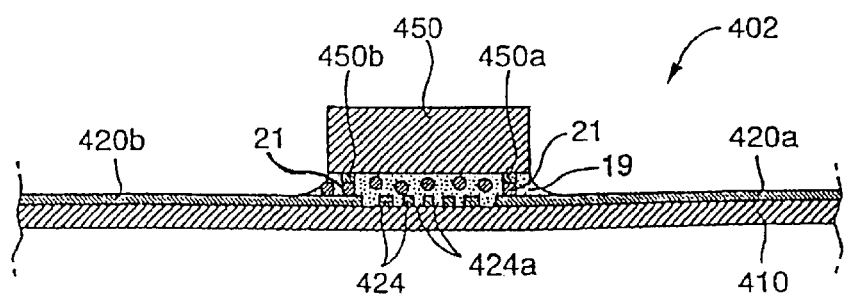
FIG. 8 is a cross-sectional view of the circuit board in FIG. 7, taken along line A—A.

FIG. 7 is a plan view showing a mounting structure in a wiring board of this embodiment. FIG. 8 is a cross-sectional view of the wiring board in FIG. 7, taken along line A—A. As shown in these figures, a dummy wiring layer 424 formed on an base film 410 of the second embodiment includes slits 424a, namely a plurality of apertures, extending in the longitudinal direction of the IC chip 450, which are formed by partly removing a copper foil. Since the area of the dummy wiring layer 424 is thus textured, if viewed from the side of the IC chip 450, the bonding strength of the IC chip 450 by the adhesive resin 19 is equally increased as in the first embodiment.

In the second embodiment, the slits 424a arranged in the dummy wiring layer 424 extend in the longitudinal direction of the IC chip 450. Alternatively, the slits 424a may be arranged in the transverse direction of the IC chip 450, or may be arranged both in the longitudinal and transverse directions so that they cross each other, or may be diagonally arranged.

3. Third Embodiment

A third embodiment of the present invention is different from the first embodiment in the shape of the dummy wiring layer. The rest of the third embodiment remains unchanged from that of the first embodiment, and the discussion about it is omitted. In the figures, components identical to those described in conjunction with the first embodiment are designated with the same reference numerals.

In the above-referenced second embodiment, the bond of the IC chip 450 increases while the presence of the slits 424a increases the exposed area of the base film 410 where the IC chip 450 is mounted. For this reason, the amount of moisture and light, penetrating through the base film 410, increases. The second embodiment may suffer more from the degradation in the reliability and performance of the IC chip 450, than the first embodiment.

Figure 9:
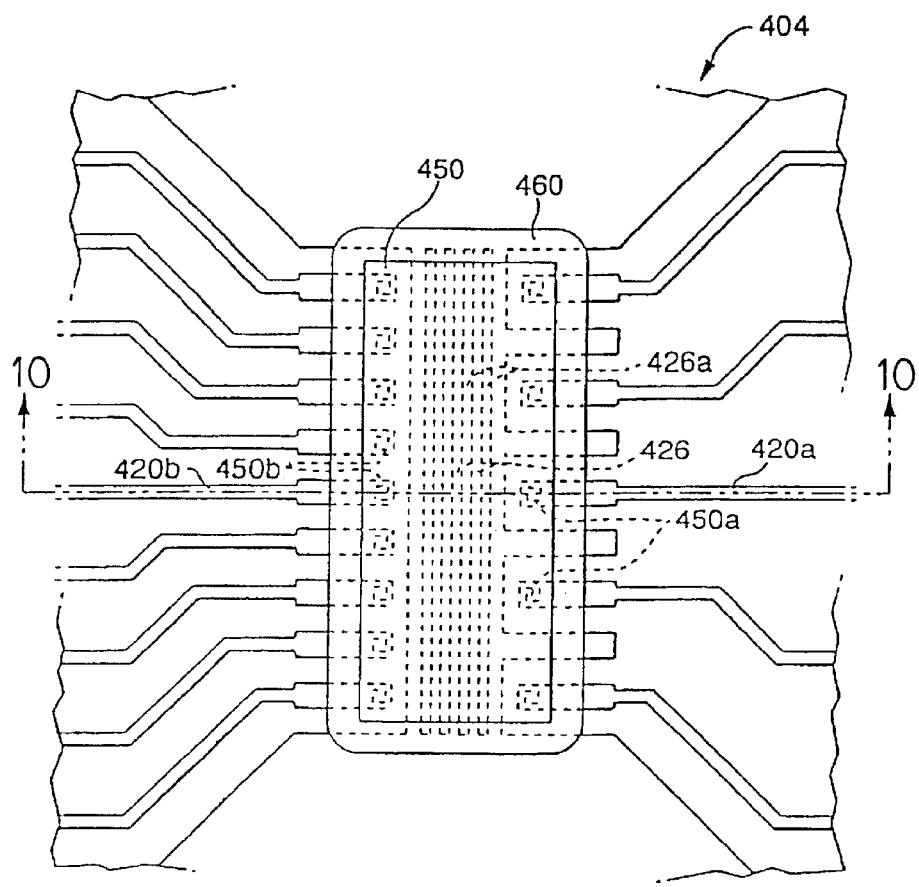
FIG. 9 is a plan view of a circuit board of a third embodiment of the present invention.
Figure 10:
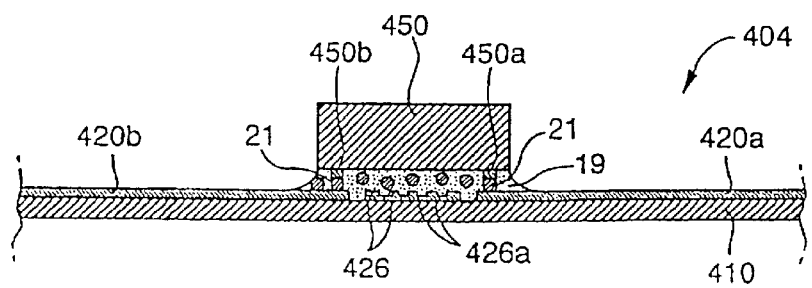
FIG. 10 is a cross-sectional view of the circuit board in FIG. 9, taken along line A—A.

Discussed next is the mounting structure of the circuit board of the third embodiment which improves the bond of the IC chip 450 while maintaining the reliability and performance levels of the IC chip 450 as good as those in the first embodiment. FIG. 9 is a plan view showing the mounting structure in the circuit board of this embodiment, and FIG. 10 is a cross-sectional view of the mounting structure in FIG. 9, taken along line A—A. As shown in these figures, a dummy wiring layer 426 arranged on an FPC board 404 of the third embodiment includes a plurality of grooves 426a, as in the second embodiment. Unlike the second embodiment, however, no copper foil is removed in the grooves 426a. As can be seen from FIG. 10, the copper foil is thinned, but not completely removed in the grooves 426a. For this reason, the exposed area of the base film 410 is minimized where the IC chip 450 is mounted, and most of moisture and light penetrating through the base film 410 are blocked by the dummy wiring layer 426. As a result, the degradation in the reliability and performance of the IC chip 450 are prevented as in the first embodiment. Since the area where the dummy wiring layer 426 is mounted is textured, if viewed from the side of the IC chip 450, the bond of the IC chip 450 by the adhesive resin 19 increases as in the first embodiment.

The dummy wiring layer 426 is produced in the following methods. Referring to FIG. 9, for example, a copper foil pattern having the sum of the area of the dummy wiring layer 426 and the area of the grooves 426a is formed, and then the area of the grooves 426a is subjected to light etching. Conversely, referring to FIG. 9, a copper foil pattern having the sum of the area of the dummy wiring layer 426 and the area of the grooves 426a is formed, and then the dummy wiring layer except for the area of the grooves 426a is thickened through copper plating.

4. Fourth Embodiment

A fourth embodiment of the present invention is different from the first embodiment in terms of the shape of the dummy wiring layer, the layout of semiconductor-side terminals and board-side terminals, and the liquid-crystal display panel to which a circuit board is connected. The rest of the fourth embodiment remains unchanged from that of the first embodiment, and the discussion about it is omitted. In the figures, components identical to those described in conjunction with the first embodiment are designated with the same reference numerals.

Figure 11:
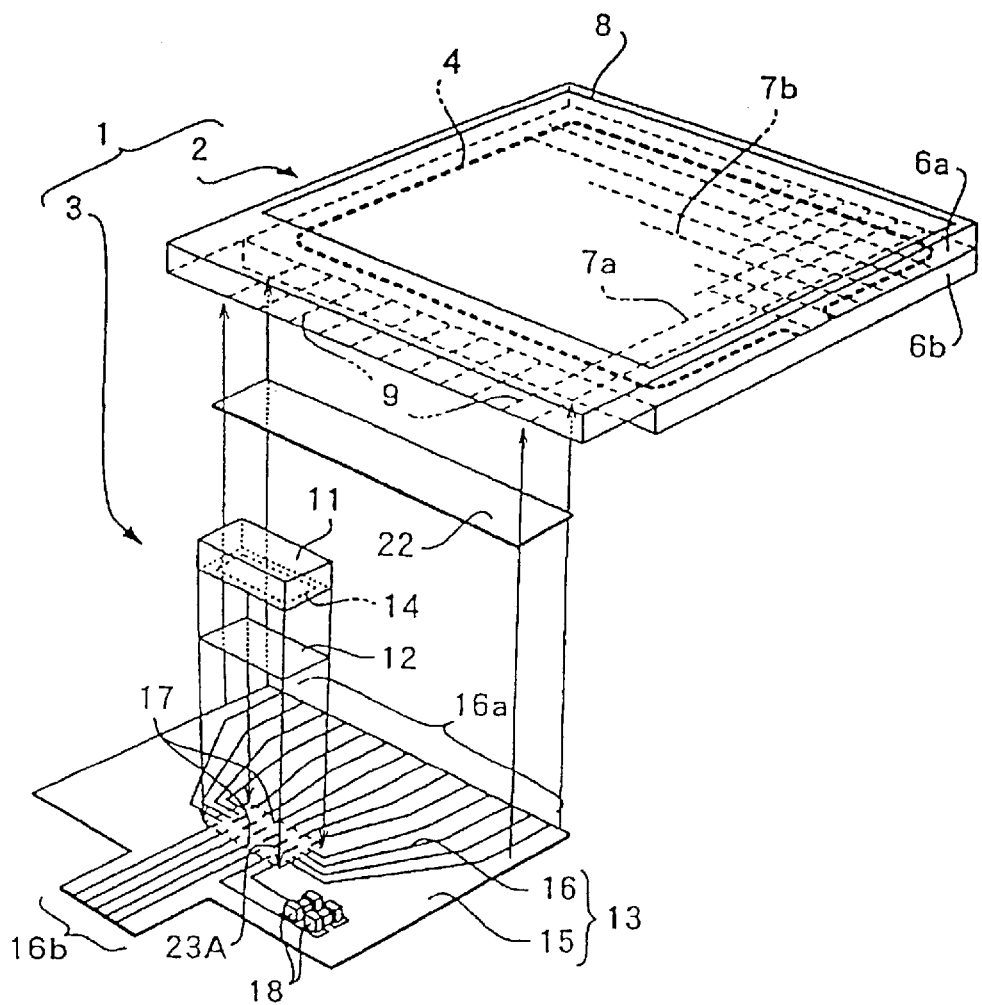
FIG. 11 is an exploded perspective view showing a liquid-crystal device of a fourth embodiment of the present invention.

FIG. 11 is an exploded perspective view showing a liquid-crystal display device 1 of this embodiment. The liquid-crystal display device 1 is produced by connecting a circuit board 3 to a liquid-crystal display panel 2. The liquid-crystal display panel 2 is provided with an illumination device, such as a backlight, and other accessories, as necessary.

The liquid-crystal display panel 2 includes a pair of substrates 6a and 6b which are bonded to each other by a sealing material 4, and a liquid crystal of STN (Super Twisted Nematic) type is encapsulated in a gap, namely, a cell gap, between the two substrates. The substrates 6a and 6b are typically constructed of a light-transmissive material, such as glass or a synthetic resin. A polarizer 8 is bonded to the external surface of each of the substrates 6a and 6b.

Electrodes 7a are formed on the internal surface of the one substrate 6a and electrodes 7b are formed on the internal surface of the other substrate 6b. These electrodes may be patterned into strips, characters, numerals, and other shapes. The electrodes 7a and 7b are constructed of a light-transmissive conductive material such as ITO (Indium Tin Oxide).

The one substrate 6a has an extension portion (terminal area) projected from its coextensive area with the other substrate 6b, and has a plurality of connection terminals 9 on the extension portion. The connection terminals 9 are produced when the electrodes 7a are formed on the substrate 6a, and the connection terminals 9 are constructed of ITO, for example. The connection terminal 9 includes a member extending from the electrode 7a and a member which is connected to the electrode 7b via a conductor member (not shown).

The electrodes 7a and 7b, and the connection terminals 9 are arranged in a large number at an extremely fine pitch on the substrates 6a and 6b. To distinctly present the structure, FIG. 11 diagrammatically shows only some of them with the pitch intentionally expanded with the remaining portion omitted. Also, FIG. 11 does not show the connected state of the connection terminal 9 and the electrode 7a, and the connected state of the connection terminal 9 and the electrode 7b.

A circuit board 3 is produced by mounting a liquid-crystal driving IC chip 11, as a semiconductor chip, on a wiring board 13 at a predetermined location, and further by mounting chip component 18 on the wiring board 13 at another predetermined location. The wiring board 13 is manufactured by forming a wiring pattern 16 of Cu or the like on a base board (base film) 15 as a flexible base material such as polyimide.

The wiring pattern 16 may be attached to the base board 15 using an adhesive agent layer, or may be directly attached to the base board 15 using a film forming technique such as sputtering or roll coating. The wiring board 13 may also be manufactured by forming the wiring pattern 16 of Cu on a relatively hard and thick substrate, such as an epoxy substrate.

When components are mounted on the wiring board 13 of a flexible base material (base board 15), a COF (Chip On Film) circuit board is manufactured. On the other hand, when components are mounted on the wiring board 13 of a hard material (base board), a COB (Chip On Board) circuit board is manufactured.

Referring to FIG. 11, the wiring pattern 16 includes output terminals 16a formed on one side of the circuit board 3 and input terminals 16b formed on the opposite side of the circuit board 3. The wiring pattern 16, within an area where the liquid crystal driving IC chip 11 is to be mounted, forms board-side terminals 17.

The liquid crystal driving IC chip 11 has a plurality of bumps 14, as semiconductor-side terminals, on its bonding surface, namely, active surface. The liquid crystal driving IC chip 11 is mounted on the base board 15 at a predetermined location using an anisotropic conductive film 12 as an adhesive agent. The chip component 18 is mounted onto the base board 15 at a predetermined location through soldering. Contemplated as the chip component 18 are passive elements, such as a capacitor or a resistor, or electronic components, such as a connector.

Figure 12:
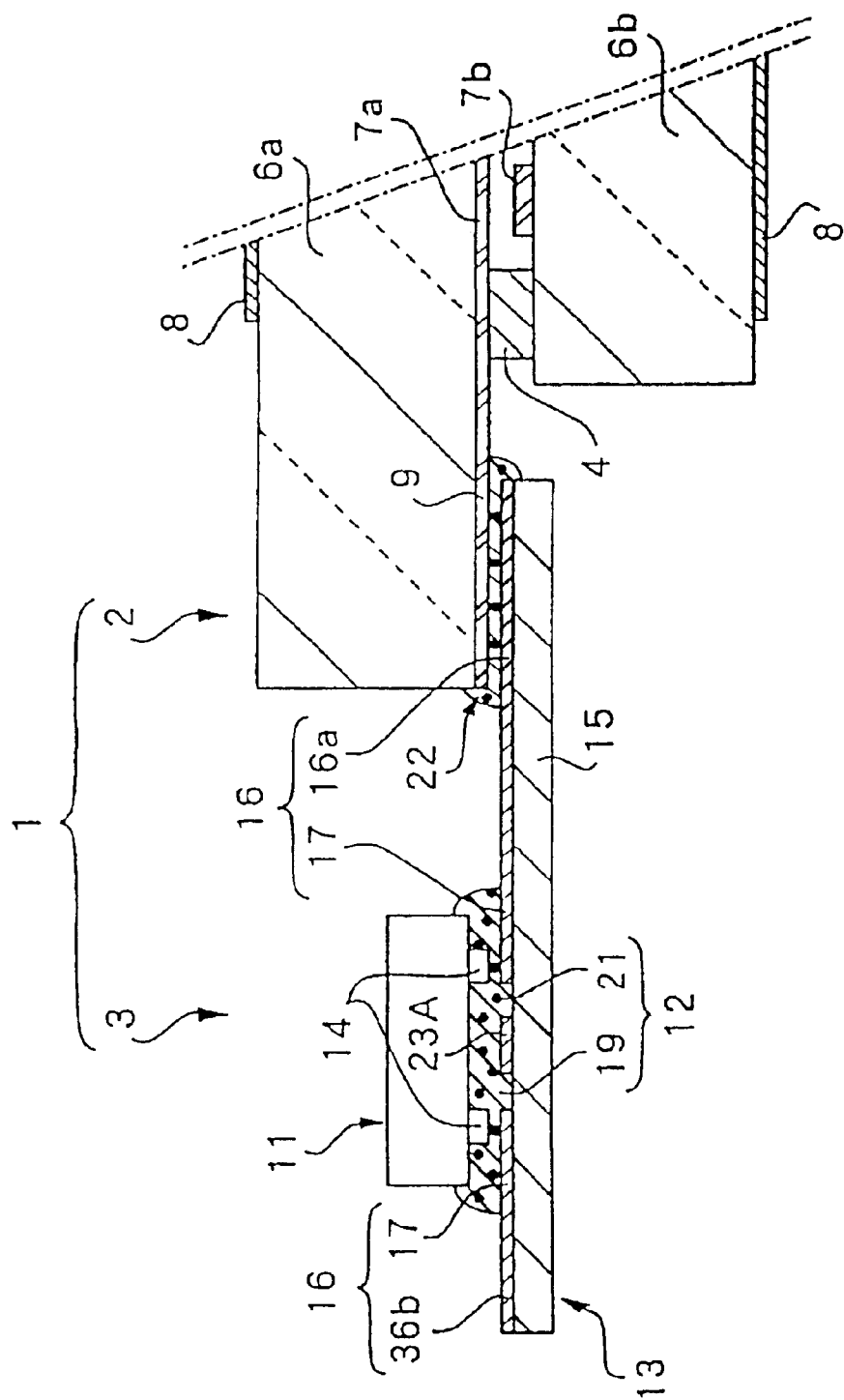
FIG. 12 is a cross-sectional view partially showing the liquid-crystal device of the fourth embodiment.

The anisotropic conductive film 12 is produced by mixing a plurality of electrically conductive particles 21 into the adhesive resin 19 as shown in FIG. 12. The liquid crystal driving IC chip 11 is affixed to the base board 15 by the adhesive resin 19 within the anisotropic conductive film 12. The bumps 14 of the liquid crystal driving IC chip 11 are electrically connected to the board-side terminals 17 of the wiring pattern 16 via electrically conductive particles 21 within the anisotropic conductive film 12.

When the circuit board 3 shown in FIG. 12 is produced, the wiring board 13 is first manufactured by forming the wiring pattern 16 having a predetermined pattern on the base board 15, and the liquid crystal driving IC chip 11 is heated and pressed onto the anisotropic conductive film 12 against the wiring board 13 at a predetermined location so that the adhesive resin 19 within the anisotropic conductive film 12 is fused. The liquid crystal driving IC chip 11 is thus mounted onto the wiring board 13.

Solder is patterned on the wiring board 13 at a location where the chip component 18 (see FIG. 11) is to be mounted, through printing or dispensing. The chip component 18 is placed onto the solder pattern, and the wiring board in its state is introduced into a high-temperature furnace heated to 200° C. to 250° C. for a short duration of time, and is then taken out of the furnace and is cooled.

The heating time is as short as possible, but still needs to be long enough to fuse the solder. When a series of soldering process steps, a so-called solder reflow process, is completed, the chip component 18 is soldered and thus mounted at its predetermined location to the wiring board 13, which has already the liquid crystal driving IC chip 11 thereon.

The order of the step of mounting the IC chip 11 onto the wiring board 13 and the step of mounting the chip component onto the wiring board 13 may be reversed. Specifically, the IC chip 11 may be mounted on the wiring board 13 after the chip component 18 is mounted on the wiring board 13.

The circuit board 3 thus constructed is connected to the extension portion of the substrate 6a of the liquid-crystal display panel 2 via an anisotropic conductive film 22 as shown in FIG. 12. Like the anisotropic conductive film 12, the anisotropic conductive film 22 is manufactured of an adhesive resin and electrically conductive particles mixed into the adhesive resin. Referring to FIG. 12, the adhesive resin bonds the circuit board 3 and the substrate 6a, and the electrically conductive particles electrically connect the output terminals 16a of the circuit board to the connection terminals 9 of the substrate.

Figure 13:
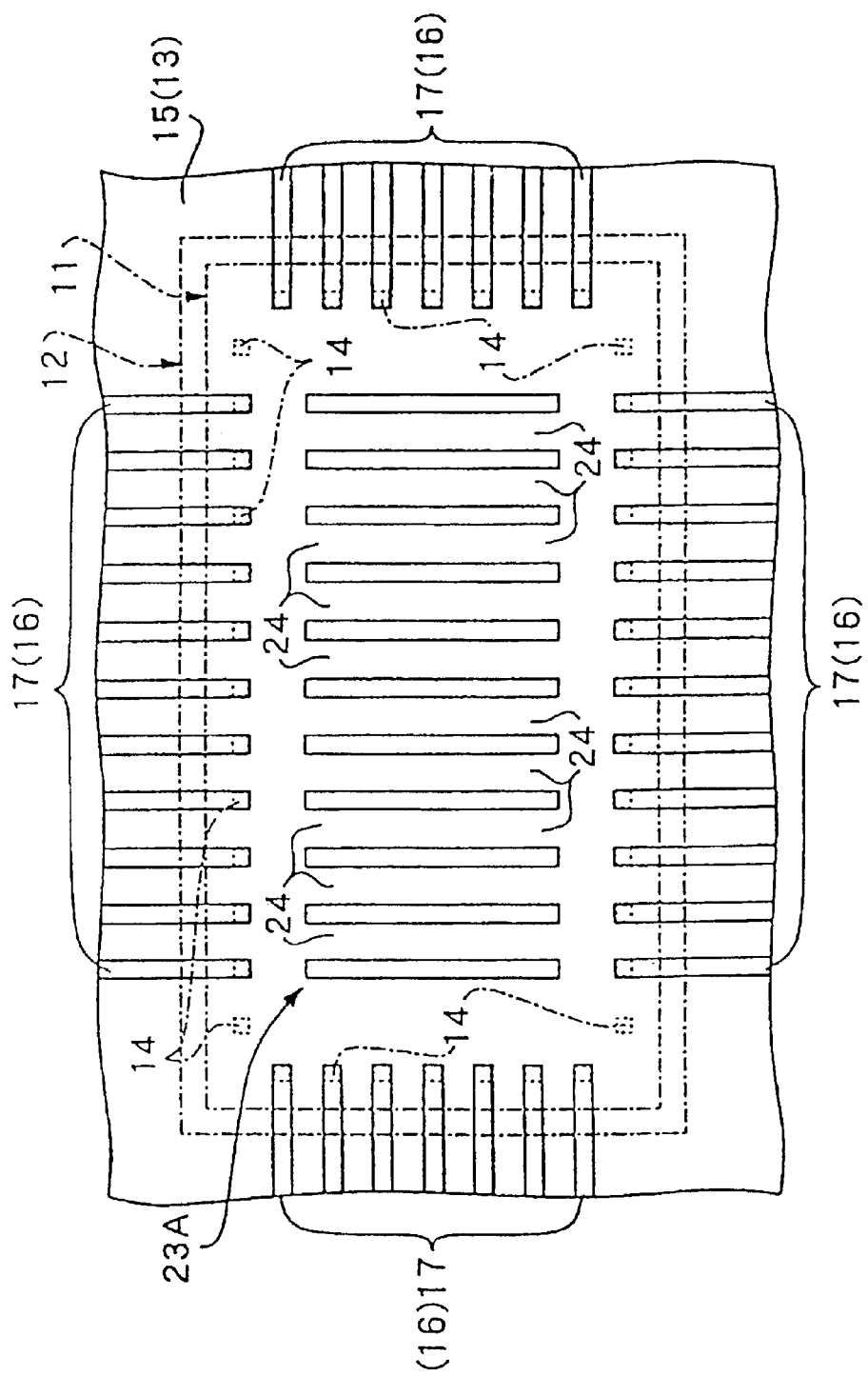
FIG. 13 is a plan view partially showing the circuit board of the fourth embodiment in a state prior to the mounting of an IC chip 11 thereon.

In the circuit board 3, a dummy wiring layer 23A is arranged inside the board-side terminals 17, within an area where the liquid crystal driving IC chip 11 is mounted, on the surface of the base board 15. The dummy wiring layer 23A is composed of a plurality of isolated line segment patterns laterally running in parallel (a plurality of line segment patterns in parallel with the short side of the IC chip 11) as shown in FIG. 13. Openings 24 opened to the outside are arranged between the line segment patterns.

The dummy wiring layer 23A may be individually produced in its own step. However, in this embodiment, when the board-side terminals 17 and the wiring pattern 16 are produced using a known patterning technique, such as a photolithographic technique, the dummy wiring layer 23A is formed of the same material, such as Cu, for example, at the same time. When the surface of the board-side terminals 17 of Cu is plated with Ni, Au, Sn, or solder, the surface of the dummy wiring layer 23A is also plated with the same material.

It is difficult to use electrolytic plating in the above plating process, because the dummy wiring layer 23A of this embodiment is composed of the electrically isolated line segment patterns. The dummy wiring layer 23A is preferably plated using electroless plating.

Since the dummy wiring layer 23A has a metal-based structure of Cu or the like, plated with Ni, Au, or other material, the dummy wiring layer 23A exhibits a higher bond to the adhesive resin in the anisotropic conductive film 12 than the base board 15 of polyimide or the like. The use of the dummy wiring layer increases the bonding area of the adhesive agent on the base board side, thereby increasing the bonding strength. In addition, the dummy wiring layer prevents moisture from penetrating from the base board side, reducing a drop in the bonding strength of the adhesive agent with time. The use of the dummy wiring layer 23A, arranged in the area where the liquid crystal driving IC chip 11 is mounted on the base board 15, increases the bonding strength between the anisotropic conductive film 12 and the base board 15, namely, the bonding strength between the liquid crystal driving IC chip 11 and the base board 15. As a result, the reliability of the connection of the liquid crystal driving IC chip 11 to the base board 15 is improved.

The dummy wiring layer 23A has the openings 24. When the anisotropic conductive film 12 is heated and pressed onto the base board 15, part of the pressed anisotropic conductive film 12 flows out through the opening 24. For this reason, residual stress in the anisotropic conductive film 12 is reduced, and the thickness of the anisotropic conductive film 12 is made uniform. With this arrangement, the base board 15 is free from distortion and has a reduced residual stress.

5. Fifth Embodiment

A fifth embodiment of the present invention is different from the fourth embodiment in the shape of the dummy wiring layer. The rest of the construction of the fifth embodiment remains unchanged from that of the fourth embodiment, and the discussion about it is omitted. In the figures, components identical to those in connection with the fourth embodiment are designated with the same reference numerals described in connection with the first embodiment.

Figure 14:
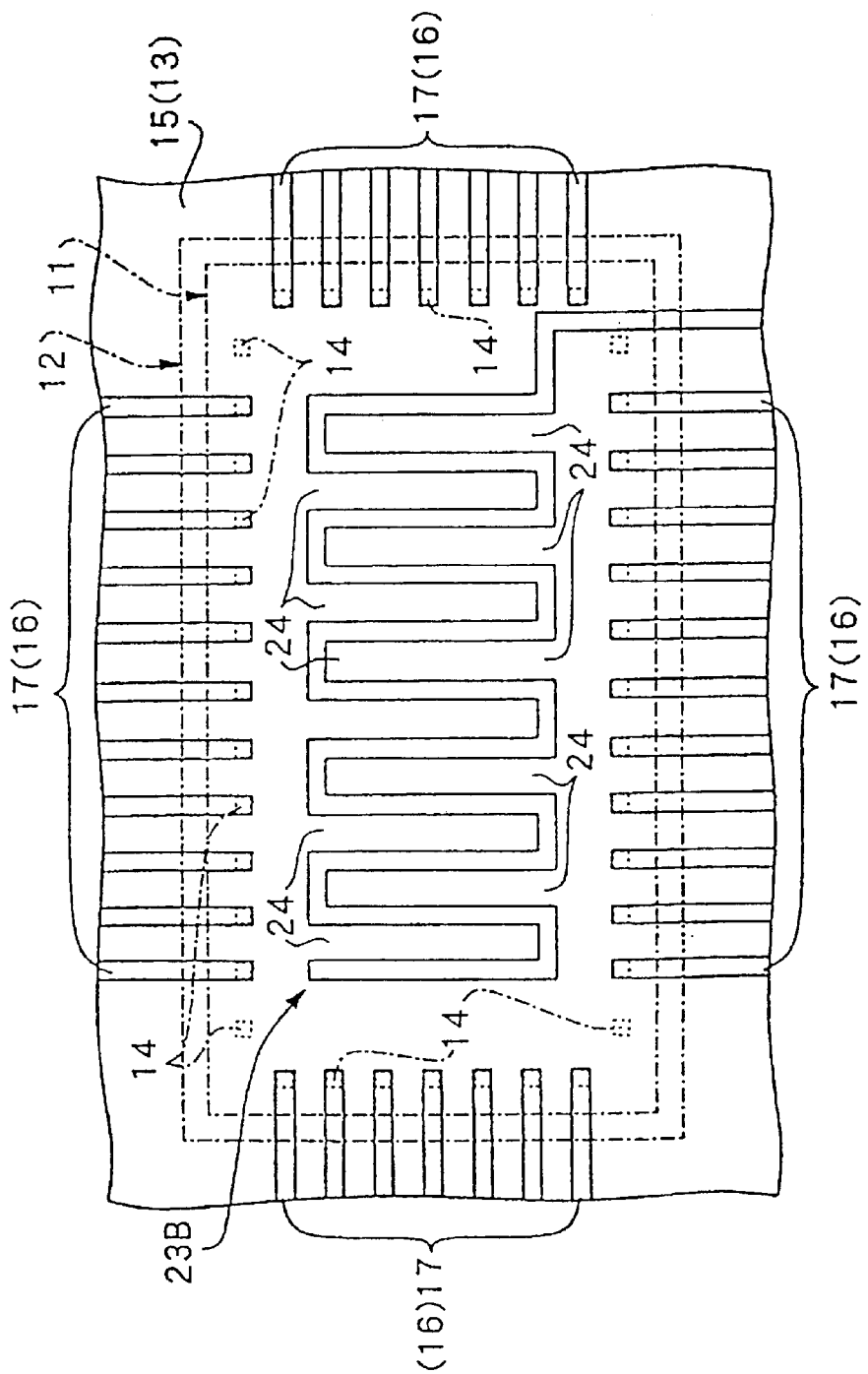
FIG. 14 is a plan view partially showing a circuit board of a fifth embodiment in a state prior to the mounting of the IC chip 11 thereon.

FIG. 14 is a partial plan view showing a circuit board of this embodiment prior to the mounting of an IC chip 11 for liquid crystal driving. A dummy wiring layer 23B of this embodiment is formed of a single continuous pattern that extends in lateral directions (namely, from left to right and from right to left) in a serpentine fashion. The dummy wiring layer 23B is also associated with openings 24 open to the outside.

Since the dummy wiring layer 23B is a single connected pattern, electrolytic plating is used to plate the dummy wiring layer 23B.

The use of the dummy wiring layer 23B increase the bonding strength between the anisotropic conductive film 12 and the base board 15, namely, the bonding strength between the liquid crystal driving IC chip 11 and the base board 15, and as a result, the reliability of the connection of the liquid crystal driving IC chip 11 to the base board 15 is improved.

Since the dummy wiring layer 23B is associated with the openings 24, the anisotropic conductive film 12 flows out when the anisotropic conductive film 12 is heated and pressed onto the base board 15. The residual stress in the anisotropic conductive film 12 is reduced, and the thickness of the anisotropic conductive film 12 is made uniform. The base board 15 is thus free from deformation with its residual stress reduced.

6. Sixth Embodiment

A sixth embodiment of the present invention is different from the fourth embodiment in the shape of the dummy wiring layer. The rest of the construction of the sixth embodiment remains unchanged from that of the fourth embodiment, and the discussion about it is omitted. In the figures, components identical to those in connection with the fourth embodiment are designated with the same reference numerals described in connection with the first embodiment.

Figure 15:
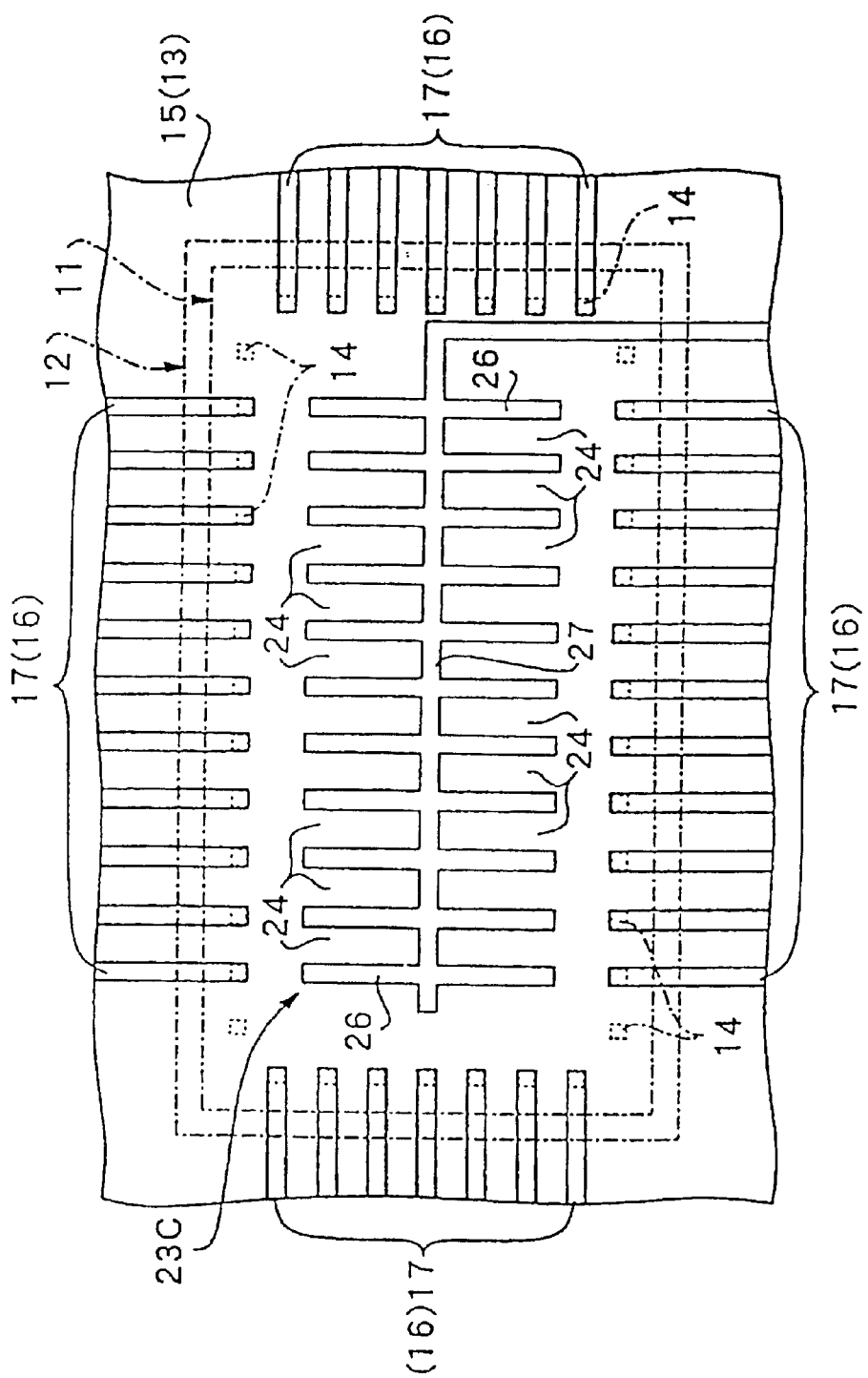
FIG. 15 is a plan view partially showing a circuit board of a sixth embodiment in a state prior to the mounting of the IC chip 11 thereon.
Figure 16:
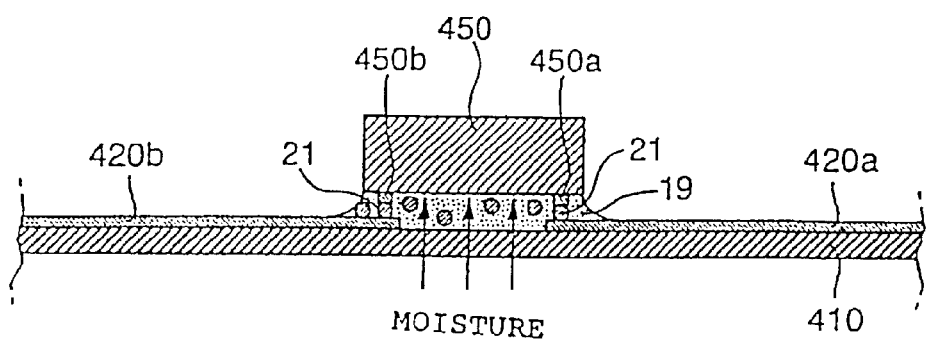
FIG. 16 is a cross-sectional view showing a conventional circuit board.

FIG. 15 is a partial plan view showing a circuit board of this embodiment prior to the mounting of an IC chip 11 for liquid crystal driving. A dummy wiring layer 23C of this embodiment is a continuous pattern that is formed of a plurality of line segment patterns 26 (first line segment region) running in parallel in one direction (from left to right) and a straight line pattern 27 (second line segment region) transversely connecting the line segment patterns 26. The dummy wiring layer 23C is associated with openings 24 open to the outside. Since the dummy wiring layer 23C is also a single connected pattern, electrolytic plating is preferably used to plate the dummy wiring layer 23C.

The use of the dummy wiring layer 23C increase the bonding strength between the anisotropic conductive film 12 and the base board 15, namely, the bonding strength between the liquid crystal driving IC chip 11 and the base board 15, and as a result, the reliability of the connection of the liquid crystal driving IC chip 11 to the base board 15 is improved.

Since the dummy wiring layer 23C is associated with the openings 24, the pressed anisotropic conductive film 12 flows out when the anisotropic conductive film 12 is heated and pressed onto the base board 15. The residual stress in the anisotropic conductive film 12 is reduced, and the thickness of the anisotropic conductive film 12 is made uniform. The base board 15 is thus free from deformation with its residual stress reduced.

7. Modifications

Modifications applicable to the above-referenced embodiments are discussed. In the discussion of the following modifications, only the difference from each of the above-referenced embodiments is described.

7.1 In each of the above-referenced embodiments, the liquid crystal display panel is an active matrix addressing liquid-crystal display panel having an encapsulated liquid crystal with a TN type electrooptical characteristic, employing TFD (Thin Film Diode) as a two-terminal switching element, or a passive matrix addressing liquid-crystal display panel having an encapsulated liquid crystal with an STN (Super Twisted Nematic) type electrooptical characteristic. The liquid-crystal display panel is not limited to these types. From the standpoint of driving method, employed as the liquid-crystal display panel are a static driving liquid-crystal panel, an active matrix addressing liquid-crystal panel with a three-terminal switching device, such as a TFT (Thin Film Transistor), or a two-terminal switching device, such as an MIM (Metal-Insulator-Metal). From the standpoint of electrooptical characteristics, a diversity of liquid-crystal display panels may be employed including the one of a guest-host type, a phase-change type, a ferroelectric type, BTN type employing a bistable twisted nematic liquid crystal having memory function.

7.2 The flat display panel employed in the present invention is not limited to the liquid-crystal display panel. The flat display panel employed in the present invention may also be an EL (Electro-Luminescence) display panel, a PDP (Plasma Display Panel) panel, or an FED (Field Emission Display) panel.

7.3 In each of the above-referenced embodiments, the semiconductor device as a driving circuit is mounted on the circuit board, and the circuit board is then connected to the flat display panel. The circuit board of the present invention connected to the flat display panel may include at least one of the semiconductor device of the driving circuit, the semiconductor device for the video signal processing circuit, and the semiconductor device for other circuit.

7.4 In each of the above-referenced embodiments, the circuit board of the present invention is used as the component for the liquid-crystal display device. Alternatively, the circuit board of the present invention may be used as a component in any device other than the liquid-crystal display device.

7.5 In each of the above-referenced embodiments, the projector and portable telephone are discussed as an example of the equipment which incorporates the display device having the circuit board of the present invention. Besides these, examples of the equipment incorporating the display device having the circuit board of the present invention may be liquid-crystal television, view-finder type, direct-monitor viewing type video tape recorder, car navigation system, electronic pocketbook, electronic calculator, wordprocessor, workstation, portable telephone, pager, video phone, POS (Point of Sales) terminal, and apparatus having a touch panel.

7.6 The present invention is not limited to the above-referenced embodiments. A diversity of changes is possible within the scope of the present invention and within the scope of the equivalents defined in the claims.

What is claimed is:

1. A circuit board comprising:
 a wiring board including a base material having insulation, and a plurality of board-side terminals arranged on the base material, and
 a semiconductor chip, mounted on the wiring board, having a plurality of semiconductor-side terminals, the semiconductor-side terminals disposed along a periphery of the semiconductor chip and electrically connected to the board-side terminals,
 wherein the wiring board includes a dummy wiring layer; and
 wherein the dummy wiring layer is formed as a member having at least one recess formed on a top surface of said member, the dummy wiring layer being disposed inwardly from the board-side terminals and between the semiconductor chip and the wiring board.

2. A circuit board according to claim 1, further comprising a resin encapsulation section, which encapsulates an area where the semiconductor-side terminals are electrically connected to the board-side terminals, and bonds the semiconductor chip to the wiring board.

3. A circuit board according to claim 2, wherein the resin encapsulation section is manufactured of an anisotropic conductive film which is formed by dispersing electrically conductive particles into a resin, and
 the semiconductor-side terminals are electrically connected to the board-side terminals by the electrically conductive particles.

4. A circuit board according to claim 1, wherein the dummy wiring layer is constructed of the same material as the material of the board-side terminal.

5. A circuit board according to claim 1, wherein the base material is constructed of a material having flexibility.

6. A circuit board according to claim 1, wherein the base material is directly connected to each of the dummy wiring layer and the board-side terminals without an intervening adhesive layer.

7. A circuit board according to claim 1 wherein the dummy wiring layer includes an opening through which the base material is exposed, and which is continuous with the peripheral exposed area of th e base material.

8. A circuit board according to claim 1, wherein the dummy wiring layer is a single continuously connected region.

9. A circuit board according to claim 8, wherein the dummy wiring layer is a region curved in a serpentine fashion.

10. A circuit board according to claim 8, wherein the dummy wiring layer is a region that is a combination of a plurality of first line segments mutually running in parallel and a second line segment which extends across the first line segments.

11. A circuit board according to claim 1, wherein the dummy wiring layer comprises at least one aperture.

12. A circuit board according to claim 1, wherein the dummy wiring layer is formed of a plurality of dummy wiring regions which are spaced by exposed areas of the base material.

13. A circuit board according to claim 12, wherein the plurality of the dummy wiring regions are partially connected to each other.

14. A circuit board according to claim 1, wherein the at least one recess further comprises a plurality of recesses.

15. A display device comprising a circuit board according to claim 1, and a flat panel having connection terminals electrically connected to the circuit board.

16. A display device according to claim 15, wherein the flat panel is a liquid-crystal panel comprising a pair of opposing substrates, and a liquid crystal interposed between the pair of substrates, and
the connection terminals are formed on at least one of the pair of the substrates.

17. Electronic equipment comprising, as display means, a display device according to claim 15.

18. A circuit board comprising:
a base;
a plurality of base terminals formed on said base;
a dummy wiring layer formed on said base interior of said base terminals;
wherein the dummy wiring layer is formed as a member having at least one recess formed on a top surface of said member;
a chip mounted to said base over said dummy wiring layer; and
a plurality of chip terminals formed on said chip, said chip terminals being connected to said base terminals.

19. The circuit board of claim 18 wherein the dummy wiring layer is shaped so as to include outboard facing openings.

20. The circuit board of claim 18 wherein the dummy wiring layer is curved in a serpentine fashion.

21. The circuit board of claim 18 wherein the dummy wiring layer is a plurality of first parallel line segments interconnected by a second line segment transverse to the plurality of first parallel line segments.

22. The circuit board of claim 18 wherein the dummy wiring layer is a plurality of spaced apart dummy wiring regions.

23. The circuit board of claim 18 wherein the dummy wiring layer includes at least one recess.

24. A circuit board comprising:
a semiconductor chip including a plurality of chip terminals;
a base being pervious to moisture and including a plurality of base terminals, each base terminal being connected to the respective chip terminal; and
a dummy wiring layer being formed as a member having a plurality of grooves formed therein, wherein the dummy wiring layer is disposed inwardly from the base terminals and between the semiconductor chip and the base so as to prevent moisture from reaching the semiconductor chip through the base.

25. A circuit board according to claim 24 wherein the dummy wiring layer is grounded.

26. A circuit board comprising:
a semiconductor chip including a plurality of chip terminals;
a base being selected from the group consisting of polyimide, polyethylene terephtalate and polyester, and including a plurality of base terminals, each base terminal being connected to the respective chip terminal; and
a dummy wiring layer including copper film formed as a member having a plurality of grooves formed therein, the dummy wiring layer disposed inwardly from the base terminals and between the semiconductor chip and the base.

27. A display device comprising:
a scanning line;
a data line intersecting with the scanning line;
an electrode, at least one of the scanning line and the data line being connectable thereto;
a substrate where the electrode is formed;
a base bonded with the substrate, being pervious to moisture, and including a plurality of base terminals;
a semiconductor chip supplying at least one of a data signal and a scanning signal to the electrode, the semiconductor chip including a plurality of chip terminals, each base terminal being connected to the respective chip terminal; and
a dummy wiring layer being an impervious member having a plurality of grooves formed therein, the dummy wiring layer disposed inwardly from the base terminals and between the semiconductor chip and the base so as to prevent moisture from reaching the semiconductor chip through the base.

28. A liquid crystal device comprising:
a pair of substrates;
a liquid crystal disposed between the pair of substrates;
a first electrode formed to one of the pair of substrates;
a second electrode formed to the other of the pair of substrates;
a base connected to one of the pair of substrates, being permeable to moisture, and including a plurality of base terminals;
a semiconductor chip including a plurality of chip terminals and supplying a voltage to at least one of the first and the second electrodes, each base terminal being connected to the respective chip terminal; and
a dummy wiring layer being an impermeable member having a plurality of grooves formed therein and disposed inwardly from the base terminals and between the semiconductor chip and the base so as to prevent moisture from reaching the semiconductor chip through the base.

29. The circuit board of claim 1 wherein the dummy wiring layer is further defined to include a plurality of grooves formed therein.

30. The circuit board of claim 29 wherein the plurality of grooves extend in a longitudinal direction relative to the semiconductor chip.

31. The circuit board of claim 29 wherein the plurality of grooves extend in a transverse direction relative to the semiconductor chip.

32. The circuit board of claim 29 wherein the plurality of grooves extend in a diagonal direction relative to the semiconductor chip.

33. The circuit board of claim 1 wherein said member further comprises a planar member.

34. The circuit board of claim 24 wherein said member further comprises a planar member.

35. The circuit board of claim 26 wherein said member further comprises a planar member.

36. The circuit board of claim 27 wherein said member further comprises a planar member.

37. The circuit board of claim 28 wherein said member further comprises a planar member.

* * * * *